(12) United States Patent
Lin et al.

(10) Patent No.: US 8,614,502 B2
(45) Date of Patent: Dec. 24, 2013

(54) THREE DIMENSIONAL SEMICONDUCTOR ASSEMBLY BOARD WITH BUMP/FLANGE SUPPORTING BOARD, CORELESS BUILD-UP CIRCUITRY AND BUILT-IN ELECTRONIC DEVICE

(75) Inventors: Charles W.C. Lin, Singapore (SG); Chia-Chung Wang, Judung Jen Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 83 days.

(21) Appl. No.: 13/456,293

(22) Filed: Apr. 26, 2012

(65) Prior Publication Data
US 2013/0032938 A1 Feb. 7, 2013

Related U.S. Application Data

(63) Continuation-in-part of application No. 13/197,163, filed on Aug. 3, 2011.
(60) Provisional application No. 61/558,011, filed on Nov. 10, 2011.

(51) Int. Cl.
*H01L 23/495* (2006.01)
*H01L 23/48* (2006.01)
*H01L 23/12* (2006.01)

(52) U.S. Cl.
USPC ........... 257/668; 257/673; 257/674; 257/676; 257/689; 257/698; 257/700; 257/758; 257/774

(58) Field of Classification Search
USPC ......... 257/668, 673, 674, 676, 689, 698, 700, 257/758, 774
See application file for complete search history.

(56) References Cited

U.S. PATENT DOCUMENTS

| | | | |
|---|---|---|---|
| 6,555,906 B2 | 4/2003 | Towle et al. | |
| 6,750,397 B2 | 6/2004 | Ou et al. | |
| 7,042,077 B2 | 5/2006 | Walk et al. | |
| 7,161,242 B2 | 1/2007 | Yamasaki et al. | |
| 7,164,198 B2 | 1/2007 | Nakamura et al. | |
| 7,435,618 B2 | 10/2008 | Chen et al. | |
| 7,517,730 B2 | 4/2009 | Cho | |
| 7,586,188 B2 | 9/2009 | Chang | |
| 7,626,270 B2 | 12/2009 | Chen et al. | |
| 7,754,598 B2 | 7/2010 | Lin et al. | |
| 7,851,269 B2 | 12/2010 | Muthukumar et al. | |
| 7,923,826 B2 * | 4/2011 | Takahashi et al. | 257/675 |
| 7,981,728 B2 | 7/2011 | Cho | |
| 8,058,723 B2 | 11/2011 | Chia | |
| 2012/0061817 A1 * | 3/2012 | Takahashi et al. | 257/698 |
| 2012/0126388 A1 * | 5/2012 | Lin et al. | 257/690 |
| 2012/0126399 A1 * | 5/2012 | Lin et al. | 257/737 |
| 2012/0126401 A1 * | 5/2012 | Lin et al. | 257/737 |
| 2012/0129298 A1 * | 5/2012 | Lin et al. | 438/118 |
| 2012/0129299 A1 * | 5/2012 | Lin et al. | 438/118 |
| 2012/0129300 A1 * | 5/2012 | Lin et al. | 438/122 |

* cited by examiner

*Primary Examiner* — Ngan Ngo
(74) *Attorney, Agent, or Firm* — Bacon & Thomas, PLLC

(57) ABSTRACT

A semiconductor assembly board includes a supporting board, a coreless build-up circuitry and a built-in electronic device. The supporting board includes a bump, a flange and a via hole in the bump. The built-in electronic device extends into the via hole and is electrically connected to the build-up circuitry. The build-up circuitry extends from the flange and the built-in electronic device and provides signal routing for the built-in electronic device. The supporting board provides mechanical support, ground/power plane and heat sink for the coreless build-up circuitry.

12 Claims, 12 Drawing Sheets

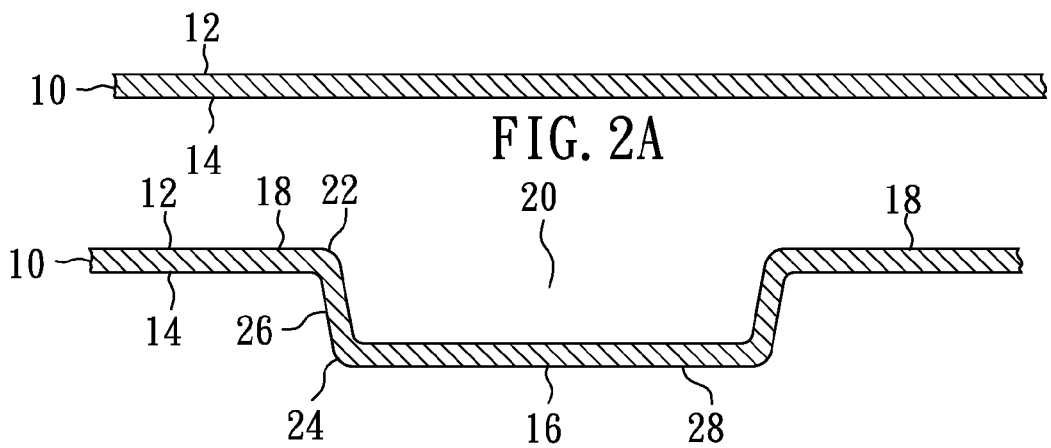
FIG. 2A
FIG. 2B
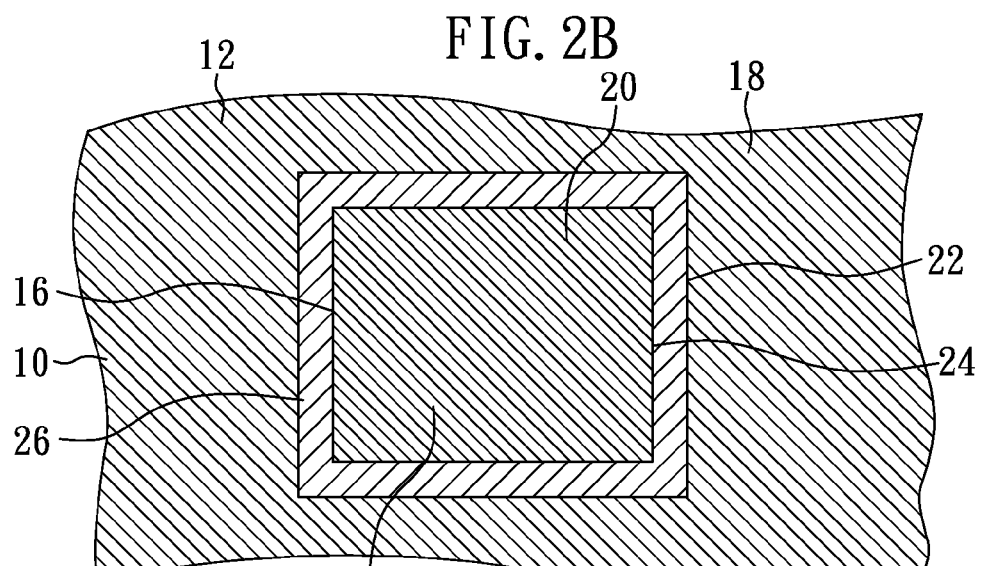
FIG. 2C
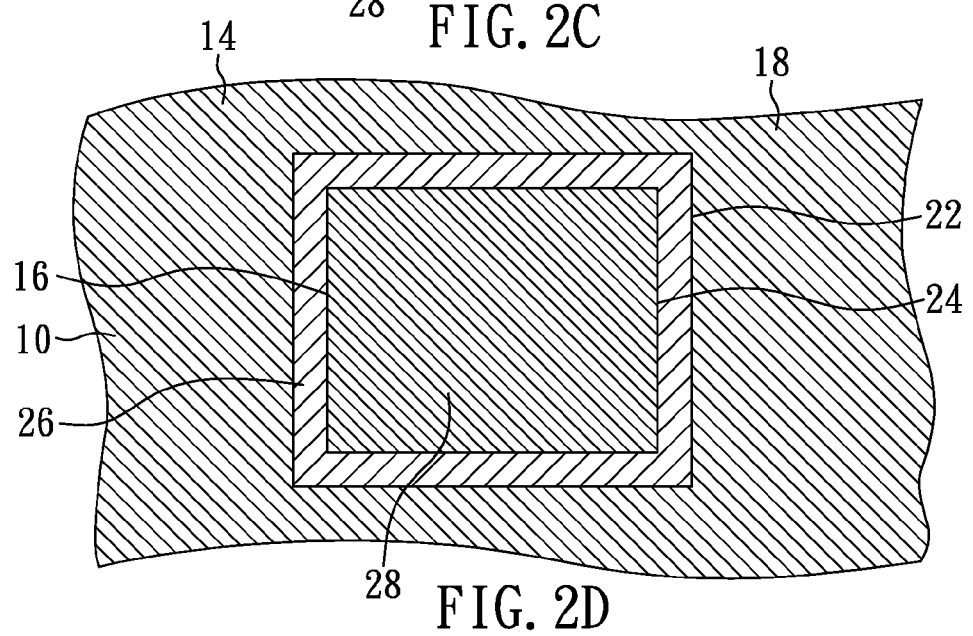
FIG. 2D

THREE DIMENSIONAL SEMICONDUCTOR ASSEMBLY BOARD WITH BUMP/FLANGE SUPPORTING BOARD, CORELESS BUILD-UP CIRCUITRY AND BUILT-IN ELECTRONIC DEVICE

CROSS REFERENCE TO RELATED APPLICATION

This application is a continuation-in-part of U.S. application Ser. No. 13/197,163, entitled "THERMALLY ENHANCED SEMICONDUCTOR ASSEMBLY WITH BUMP/BASE/FLANGE HEAT SPREADER AND BUILD-UP CIRCUITRY" filed Aug. 3, 2011, which is incorporated by reference. This application also claims the benefit of filing date of U.S. Provisional Application Ser. No. 61/558,011, entitled "THREE-DIMENSIONAL SEMICONDUCTOR ASSEMBLY WITH BUMP/FLANGE CORE BOARD AND EMBEDDED SEMICONDUCTOR DEVICE" filed Nov. 10, 2011 under 35 USC §119(e)(1).

BACKGROUND OF THE INVENTION

1. Field of the Invention

The present invention relates to a semiconductor assembly board, and more particularly to a three dimensional semiconductor assembly board, which includes a bump/flange based supporting board, a coreless build-up circuitry and a built-in electronic device.

2. Description of Related Art

High-performance three dimensional semiconductor assembly typically includes an interposer coupled to a high density interconnect substrate wherein build-up circuitry layers are deposited on both sides of a thick copper-clad-laminate core. The laminate core which is made of thick epoxy-resin-impregnated glass fiber is used to provide mechanical rigidity to the overall board.

FIG. 1 is the sectional view of a conventional three dimensional flip chip assembly wherein a laminate core is enclosed in a high density interconnect substrate 13 and an interposer 15 is mounted onto the high density interconnect substrate 13 to serve as the connection media for a flip mounted chip 17 in accordance with the prior art. Referring to FIG. 1, the high density interconnect substrate 13 comprises a core layer 131, a top and bottom build-up circuitry 132, inter-layer connection 133 (micro-via) and a plated through hole 134 that connects the build-up circuitry 132 deposited on both sides of the core.

Latest trends of electronic devices such as mobile internet devices (MIDs), multimedia devices and computer notebooks demand for faster and slimmer designs. In the frequency band of a general signal, the shorter paths of circuitry, the better the signal integrity. Thus, the size of inter-layer connection, i.e., the diameter of the micro-via and plated through hole in the substrate must be reduced in order to improve the signal delivery characteristic of the electronic component. As plated-through-hole in the copper-clad laminate core is typically formed by mechanical CNC drill, reducing its diameter in order to increase wiring density encounters seriously technical limitations and often very costly. As such, coreless substrates are proposed for packaging substrate to enable a thinner, lighter and faster design of the components. However, as coreless boards do not have a core layer to provide a necessary flexural rigidity, they are more susceptible to warpage problem when under thermal stress compared to that of conventional boards with core layers.

Furthermore, as coreless build-up circuitry removes the core layers which are normally designed for the purpose of power/ground planes as well as heat sink, electrical and thermal performances of the semiconductor device can be adversely affected especially when they are performing high frequencies transmitting or receiving of electromagnetic signals.

U.S. Pat. No. 7,435,618 to Chen et al., U.S. Pat. No. 7,517,730 to Cho, U.S. Pat. No. 7,626,270 to Chen, U.S. Pat. No. 7,754,598 to Lin et al., U.S. Pat. No. 7,851,269 to Muthukumar and U.S. Pat. No. 7,981,728 to Cho disclose various methods of forming a coreless substrate having signal delivery characteristic that is improved by eliminating the core board along with the inner through hole in the core. Since the insulating material is typically a thin epoxy or polyimide dielectric layer, even with glass fiber impregnation, their mechanical rigidity for supporting semiconductor assembly is questionable and the assembly often suffers high yield loss due to warping issue.

U.S. Pat. No. 7,164,198 to Nakamura et al., and U.S. Pat. No. 7,586,188 to Cheng disclose a coreless packaging substrate in which a re-enforcement or stiffener such as solid metal block or ceramic substrate is disposed on the surface of the coreless substrate with an opening to accommodate assembled semiconductor chip. In this approach, the re-enforcement aims to provide a critical support for the coreless build-up circuitry against warping. Although a supporting platform is created and warping issues may be resolved, etching a thick metal block or attaching a stiffener to the thin build-up circuitry is prohibitively cumbersome and prone to create many yield-loss issues such as an uncontrollable boundary line due to etching under-cut of thick metal block or bleeding of the bonding material to the cavity that would contaminate the contact pads on the coreless substrate. Furthermore, as it is difficult to accurately position the stiffener on the build-up substrate due to lateral displacement, voids and inconsistent bond lines arise between the stiffener and the coreless build-up circuitry. The assembly suffers from high yield loss, poor reliability and excessive cost.

U.S. Pat. No. 6,555,906 to Towel et al., U.S. Pat. No. 6,750,397 to Ou et al, and U.S. Pat. No. 8,058,723 to Chia disclose an assembly in which a semiconductor chip is housed in a cavity of a metal supporting frame such as a metal block before fabricating build-up circuitry. Since the cavity in the metal block is formed by etching or by micro-machining or by milling out a portion of the metal frame, the major drawbacks include low throughput. As inconsistent cavity dimension and depth control of the recess in the metal block will result in low yield, it is not suitable for high volume production. Furthermore, once the metal supporting frame is removed, the assembly will become warping again, voids and cracks at the interfaces can result in serious reliability concern.

U.S. Pat. No. 7,042,077 to Walk and U.S. Pat. No. 7,161,242 to Yamasaki et al. disclose a three-dimensional assembly in which an interposer is attached to a coreless substrate reinforced with a base material. Similar to other prior arts, the attachment of the reinforcing base can result in serious yield and reliability concerns.

In view of the various development stages and limitations in currently available three-dimensional packages for high I/O and high performance semiconductor devices, there is a need for a coreless package assembly board that can provide optimize signal integrity, adequate thermal dissipation, low warping and maintain low cost manufacturing.

SUMMARY OF THE INVENTION

The present invention provides a semiconductor assembly board that includes a supporting board, a coreless build-up circuitry and a built-in electronic device.

In a preferred embodiment, the supporting board includes a bump and a flange. The bump defines a via hole. The built-in electronic device extends into the via hole, is electrically connected to the coreless build-up circuitry and is laterally surrounded by the bump. The coreless build-up circuitry extends from the flange and the built-in electronic device and provides signal routing for the built-in electronic device. The supporting board can provide mechanical support, ground/power plane and heat sink for the coreless build-up circuitry.

In accordance with an aspect of the present invention, the supporting board includes a bump, a flange, an adhesive and a via hole, wherein (i) the bump is adjacent to and integral with the flange and extends from the flange in a first vertical direction, (ii) the flange extends laterally from the bump in lateral directions orthogonal to the first vertical direction, (iii) the via hole extends into the bump and is laterally covered by a sidewall of the bump, and (iv) the adhesive includes am opening with the bump extending thereinto, contacts the bump and the flange and extends laterally from the bump to peripheral edges of the assembly board.

The adhesive can laterally cover and surround and conformally coat a sidewall of the bump and have a first thickness (in the first/second vertical directions) where it is adjacent to the flange and a second thickness (in the lateral directions orthogonal to the first/second vertical directions) where it is adjacent to the bump that is different from the first thickness.

The bump and flange can be made of any metallic material. For instance, the bump and flange can consist essentially of copper, aluminum or copper/nickel/aluminum. The bump and flange can also consist of a buried copper, aluminum or copper/nickel/aluminum core and plated surface contacts that consist of gold, silver and/or nickel.

The built-in electronic device that includes one or more first contact pads and one or more second contact pads can extend into the via hole and be mechanically connected to the bump. Thus, the built-in electronic device can be located within the via hole or extend within and outside the via hole. In any case, bump surrounds the built-in electronic device in the lateral direction and the first contact pads of the built-in electronic device are exposed from the via hole in the first vertical direction. Additionally, the built-in electronic device can further include one or more connecting elements (such as through vias) that electrically connect the first contact pads that thee the first vertical direction and the second contact pads that face the second vertical direction.

The sequentially formed build-up circuitry can include a first dielectric layer and one or more first conductive traces. For instance, the first dielectric layer extends from the built-in electronic device and the flange in the second vertical direction and can extend to peripheral edges of the assembly board. Accordingly, the bump and the flange can be sandwiched between the adhesive and the first dielectric layer.

The first dielectric layer includes one or more first via openings that are disposed adjacent to the second contact pads of the built-in electronic device and optionally adjacent to the flange for grounding. One or more first conductive traces are disposed on the first dielectric layer (i.e. extend from the first dielectric layer in the second vertical direction and extend laterally on the first dielectric layer) and extend into the first via openings in the first vertical direction to provide signal routing for the second contact pads of the built-in electronic device and optionally provide electrical connections for the flange. Specifically, the first conductive traces can direct contact the second contact pads to provide signal routing for the built-in electronic device, and thus the electrical connection between the built-in electronic device and the build-up circuitry can be devoid of solder.

The sequentially formed build-up circuitry can include additional layers of dielectric, additional layers of via openings, and additional layers of conductive traces if needed for further signal routing. For instance, the build-up circuitry can further include a second dielectric layer, one or more second via openings and one or more second conductive traces. The second dielectric layer with one or more second via openings disposed therein is disposed on the first dielectric layer and the first conductive traces extends from the first dielectric layer and the first conductive traces in the second vertical direction) and can extend to peripheral edges of the assembly board. The second via openings are disposed adjacent to the first conductive traces. One or more second conductive traces are disposed on the second dielectric layer (i.e. extend from the second dielectric layer in the second vertical direction and extend laterally on the second dielectric layer) and extend into the second via openings in the first vertical direction to provide electrical connections for the first conductive traces. Furthermore, the first via openings and the second via openings can have the same size, and the first dielectric layer, the first conductive traces, the second dielectric layer and the second conductive traces can have flat elongated surfaces that face in the second vertical direction.

The build-up circuitry can include one or more interconnect pads to provide electrical contacts for the next level assembly or another electronic device such as a semiconductor chip, a plastic package or another semiconductor assembly. The interconnect pads extend to or beyond the first conductive traces in the second vertical direction and include an exposed contact surface that faces in the second vertical direction. For instance, the interconnect pad can be adjacent to and integral with the second conductive trace. In addition, the first conductive trace and the second conductive trace can provide an electrical interconnection between the interconnect pad and the second contact pad of the built-in electronic device disposed at the via hole of the bump. As a result, the electrical contacts (i.e. the first contact pads of the built-in electronic device and the interconnect pads of the build-up circuitry) can be electrically connected to one another and located on opposite surfaces that face in opposite vertical directions so that the assembly board can be used for a three-dimensional semiconductor assembly.

In accordance with another aspect of the present invention, the supporting board can further include a stiffener with an aperture. The bump extends into the opening of the adhesive and the aperture of the stiffener and is spaced from the stiffener. The adhesive contacts the bump, the flange and the stiffener, is sandwiched between the bump and the stiffener and between the flange and the stiffener and extends laterally from the bump to peripheral edges of the assembly board. In any case, the adhesive can be sandwiched between the flange and the stiffener and extend into a gap between the bump and the stiffener, and thus the adhesive can have a first thickness (in the first/second vertical directions) where it is adjacent to the flange and a second thickness (in the lateral directions orthogonal to the first/second vertical directions) where it is adjacent to the bump that is different from the first thickness. The stiffener can extend to peripheral edges of the assembly board and be made of organic materials such as copper-clad laminate. The stiffener can also be made of metallic materials or other thermally conductive materials such as aluminum oxide ($Al_2O_3$), aluminum nitride (AlN), silicon nitride (SiN), silicon (Si), etc. Alternatively, the stiffener can be a single layer structure or a multi-layer structure such as a circuit board or a multi-layer ceramic board or a laminate of a substrate and a conductive layer.

The built-in electronic device can be located within the peripheries of the opening and the aperture and be mechanically connected to the bump at the via hole. For instance, the built-in electronic device can be located at the via hole and the build-up circuitry can extend within and outside the via hole. Additionally, the first dielectric layer may extend into the gap between the peripheral edges of the built-in electronic device and bump so that the built-in electronic device can be mechanically connected to the bump by the first dielectric layer. Alternatively, the gap between the built-in electronic device and bump may be filled with a die attach so that the first dielectric layer does not extend into the gap and the built-in electronic device can be mechanically connected to the bump by the die attach. Moreover, when built-in electronic device is located within the via hole and below its entrance in the second vertical direction, the first conductive trace can further extend through the first via opening into the via hole. The built-in electronic device can be a silicon, glass or ceramic interposer or a semiconductor chip. Alternatively, the built-in electronic device can be a three-dimensional package that includes a semiconductor chip.

The bump can be integral with the flange and contact and be sandwiched between and space and separate the adhesive and the build-up circuitry. For instance, the bump and the flange can be a single-piece metal or include a single-piece metal at their interface, and the single-piece metal can be copper. The bump can include a first bent corner that is adjacent to the flange and the sidewall of the bump and is bent toward the flange from the sidewall of the bump. In addition to the first bent corner, the bump can further include a second bent corner that is adjacent to the sidewall of the bump, is bent toward the via hole from the sidewall of the bump and is located beyond the built-in electronic device in the first vertical direction. The second bent corner can be coplanar with the adhesive at a surface that faces the first vertical direction. Moreover, the bump can further include a floor that is adjacent to and extends laterally from the second corner in the lateral direction opposite to the flange and has an opening that is aligned with the via hole and exposes the first contact pad. The bump can also have an irregular thickness characteristic of stamping. The bump can also have a larger diameter or dimension at the flange than at the surface opposite the flange. For instance, the bump can have a cut-off conical or pyramidal shape in which its diameter or dimension increases as it extends in the second vertical direction. Accordingly, as the adhesive extends into the gap between the bump and the stiffener in the first vertical direction, the adhesive can have an increasing thickness where it is adjacent to the bump. The bump can also have a cylindrical shape with a constant diameter. Accordingly, the adhesive can have a constant thickness in the gap between the bump and the stiffener.

The via hole in the bump can have a larger diameter or dimension at the second vertical direction than at the first vertical direction. For instance, the via hole can have a cut-off conical or pyramidal shape at the region laterally covered by the sidewall of the bump in which its diameter or dimension increases as it extends in the second vertical direction. Alternatively, the via hole can have a cylindrical shape with a constant diameter at the region laterally covered by the sidewall of the bump. The via hole can also have a circular, square or rectangular periphery at its open ends. The via hole can also conform to the shape of the bump, extend into the opening and the aperture, extend through the bump in the vertical directions and extend across most of the bump in the lateral directions.

The flange can contact and be sandwiched between and space and separate the build-up circuitry and the adhesive. The flange can also have a circular, square or rectangular periphery. In addition, the flange may be spaced from or extend to peripheral edges of the assembly board.

The present invention also provides a three-dimensional semiconductor assembly in which a semiconductor device such as chip can be electrically connected to the first contact pad of the built-in electronic device. The semiconductor device can be electrically connected to the first contact pad that is exposed from the via hole of the assembly board using a wide variety of connection media including gold or solder bumps.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

The present invention has numerous advantages. The supporting board including the bump, the flange and the adhesive can provide a power/ground plane, a heat sink and a robust mechanical support for the built-in electronic device and the build-up circuitry. The stiffener can provide enhanced mechanical support for the supporting board. The assembly board and the semiconductor assembly using the same are reliable, inexpensive and well-suited for high volume manufacture. Compared to conventional art that provides an interposer between a high I/O device and a high density interconnect board with a core layer, the present invention can greatly improve the electrical performance as well as reduce the thickness of products by using a coreless build-up circuitry.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 2A and 2B are cross-sectional views showing a bump and a flange in accordance with an embodiment of the present invention;

FIGS. 2C and 2D are top and bottom views, respectively, corresponding to FIG. 2B;

DETAILED DESCRIPTION OF THE INVENTION

Embodiment 1

Figure 1:
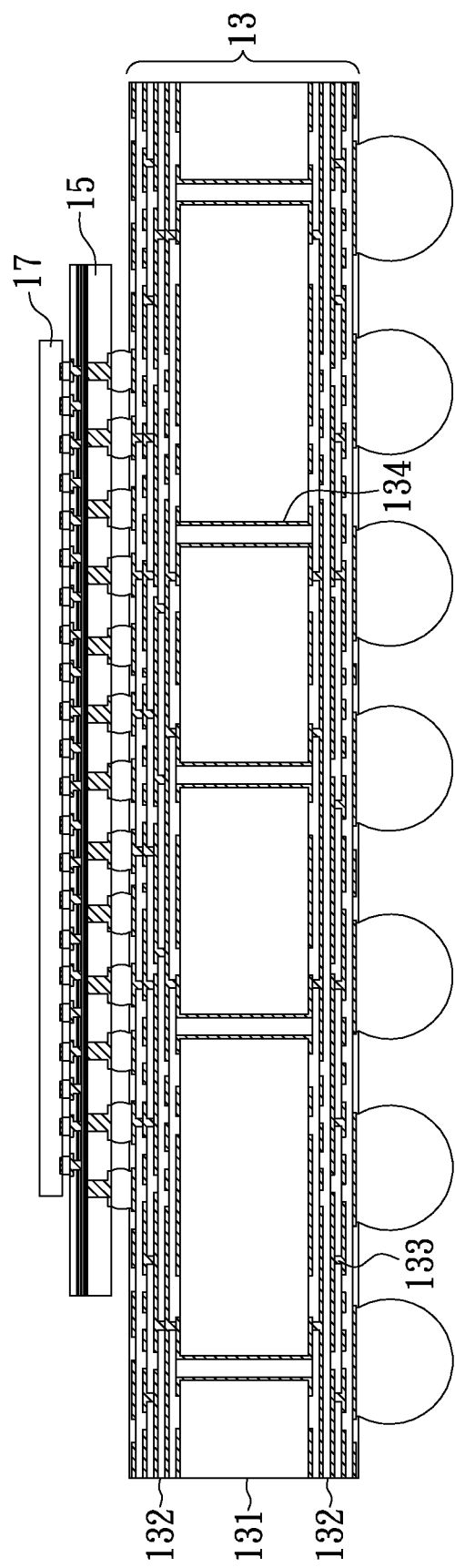
FIG. 1 is a cross-sectional view showing a conventional three dimensional flip chip assembly.

FIGS. 2A and 2B are cross-sectional views showing a method of making a bump and a flange in accordance with an embodiment of the present invention, and FIGS. 2C and 2D are top and bottom views, respectively, corresponding to FIG. 2B.

FIG. 2A is a cross-sectional view of metal plate 10 which includes opposing major surfaces 12 and 14. Metal plate 10 is illustrated as a copper plate with a thickness of 100 microns. Copper good flexibility and low cost. Metal plate 10 can be various metals such as copper, aluminum, alloy 42, iron, nickel, silver, gold, combinations thereof, and alloys thereof.

FIGS. 2B, 2C and 2D are cross-sectional, top and bottom views, respectively, of metal plate 10 with bump 16, flange 18 and cavity 20. Bump 16 and cavity 20 are formed by mechanically stamping metal plate 10. Thus, bump 16 is a stamped portion of metal plate 10 and flange 18 is an unstamped portion of metal plate 10.

Bump 16 is adjacent to and integral with flange 18 and extends from flange 18 in the downward direction. Bump 16 includes bent corners 22 and 24, tapered sidewall 26 and floor 28. Bent corners 22 and 24 are bent by the stamping operation. Bent corner 22 is adjacent to flange 18 and tapered sidewall 26 and bent corner 24 is adjacent to tapered sidewall 26 and floor 28. Tapered sidewall 26 extends outwardly as it extends in the upward direction and floor 28 extends laterally in lateral directions (such as left and right) orthogonal to the upward and downward directions. Thus, bump 16 has a cutoff pyramidal shape (resembling a frustum) in which its diameter decreases as it extends downwardly from flange 18 to floor 28 and increases as it extends upwardly from floor 28 to flange 18. Bump 16 has a height of 300 microns relative to flange 18, a dimension of 11 mm by 9 mm at flange 18 and a dimension of 10.5 mm by 8.5 mm at floor 28. Furthermore, bump 16 has an irregular thickness due to the stamping operation. For instance, tapered sidewall 26 is thinner than floor 28 since it is elongated by the stamping operation. Bump 16 is shown with a uniform thickness for convenience of illustration.

Flange 18 extends laterally from bump 16 in the lateral directions, is flat and has a thickness of 100 microns.

Cavity 20 faces in the upward direction, extends into bump 16, is covered by bump 16 in the downward direction and has an entrance at flange 18. Cavity 20 also conforms to the shape of bump 16. Thus, cavity 20 has a cut-off pyramidal shape (resembling a frustum) in which its diameter decreases as it extends downwardly from its entrance at flange 18 to floor 28 and increases as it extends upwardly from floor 28 to its entrance at flange 18. Furthermore, cavity 20 extends across most of bump 16 in the vertical and lateral directions and has a depth of 300 microns.

Figure 3A:
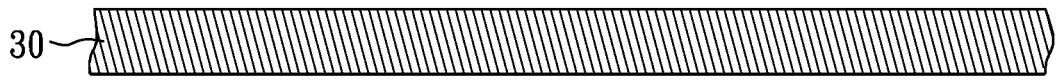
FIGS. 3A and 3B are cross-sectional views showing an adhesive in accordance with an embodiment of the present invention.
Figure 3B:
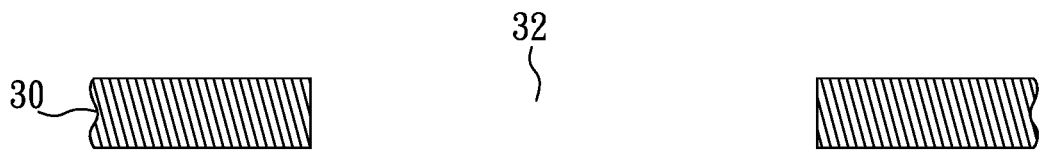
Figure 3C:
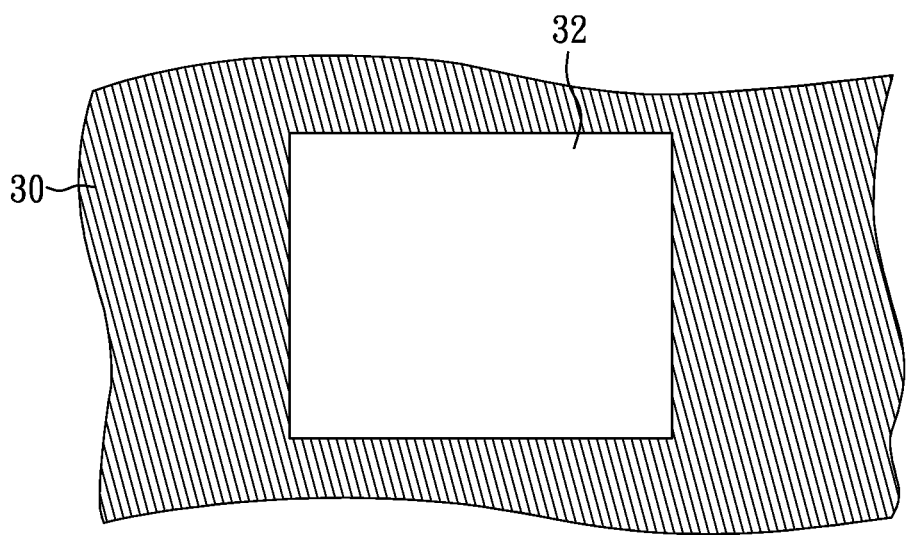
FIGS. 3C and 3D are top and bottom views, respectively, corresponding to FIG. 3B.
Figure 3D:
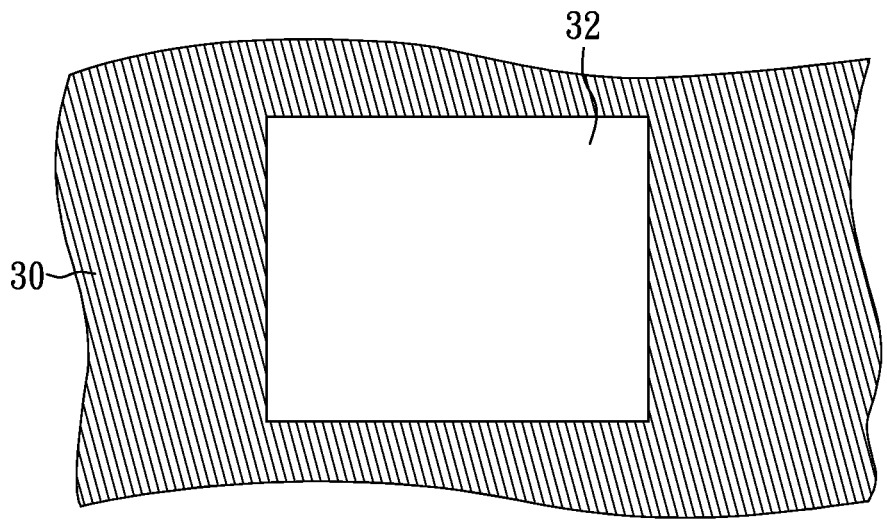

FIGS. 3A and 3B are cross-sectional views showing a method of making an adhesive in accordance with an embodiment of the present invention, and FIGS. 3C and 3D are top and bottom views, respectively, corresponding to FIG. 3B.

FIG. 34 is a cross-sectional view of adhesive 30. Adhesive 30 is illustrated as a prepreg with B-stage uncured epoxy provided as a non-solidified un-patterned sheet with a thickness of 150 microns.

Adhesive 30 can be various dielectric films or prepregs formed from numerous organic or inorganic electrical insulators. For instance, adhesive 30 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 3B, 3C and 3D are cross-sectional, top and bottom views, respectively, of adhesive 30 with opening 32. Opening 32 is a window that extends through adhesive 30 and has a dimension of 11.1 mm by 9.1 mm. Opening 32 is formed by punching through the prepreg and can be formed by other techniques such as laser cutting.

Figure 4A:
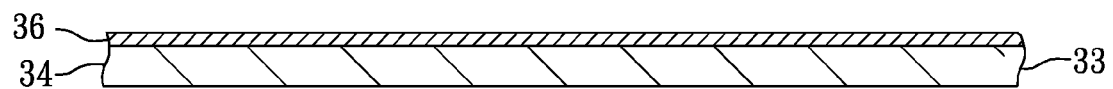
FIGS. 4A and 4B are cross-sectional views showing a stiffener including a substrate and a conductive layer in accordance with an embodiment of the present invention.
Figure 4B:
Figure 4C:
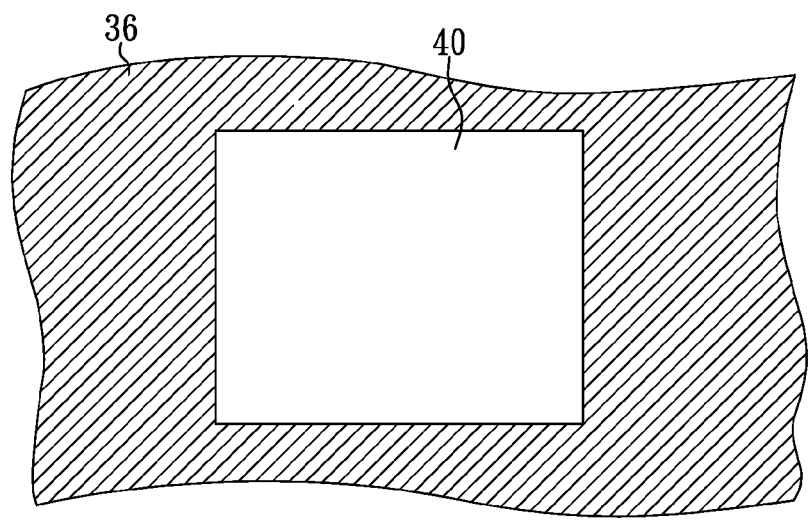
FIGS. 4C and 4D are top and bottom views, respectively, corresponding to FIG. 4B.
Figure 4D:
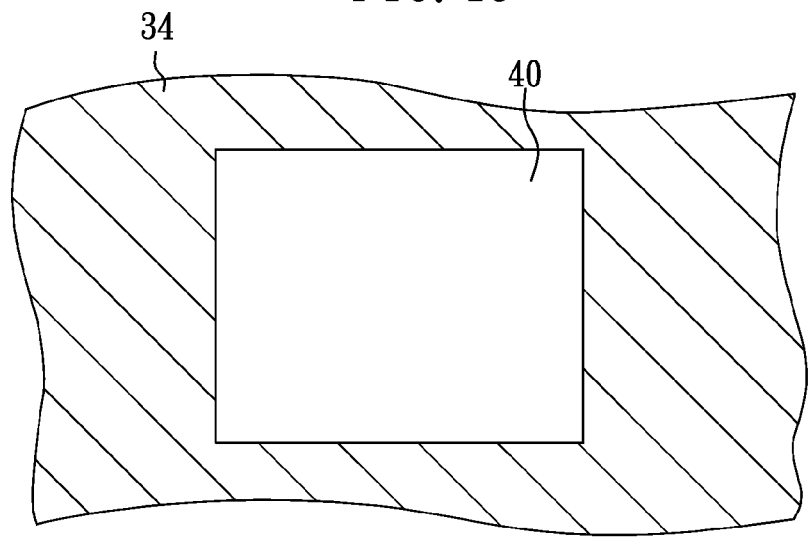

FIGS. 4A and 4B are cross-sectional views showing a method of making a laminated structure in accordance with an embodiment of the present invention, and FIGS. 4C and 4D are top and bottom views, respectively, corresponding to FIG. 4B.

FIG. 4A is a cross-sectional view of stiffener 33 that includes substrate 34 and conductive layer 36. For instance, substrate 34 is a glass-epoxy material with a thickness of 150 microns and conductive layer 36 that contacts and extends above and is laminated to substrate 34 is an unpatterned copper sheet with a thickness of 30 microns.

FIGS. 4B, 4C and 4D are cross-sectional, top and bottom views, respectively, of the stiffener 33 with aperture 40. Aperture 40 is a window that extends through stiffener 33 and has a dimension of 11.1 mm by 9.1 mm. Aperture 40 is formed by punching through substrate 34 and conductive layer 36 and can be formed with other techniques such as laser cutting with or without wet etching. Thus, opening 32 and aperture 40 have the same dimension. Furthermore, opening 32 and aperture 40 can be formed in the same manner with the same punch at the same punching station.

Substrate 34 is illustrated as a single layer dielectric structure. Stiffener 33 can also be an electrical interconnect such as a multi-layer printed circuit board or a multi-layer ceramic board. Accordingly, stiffener 33 can include embedded circuitry.

Figure 5A:
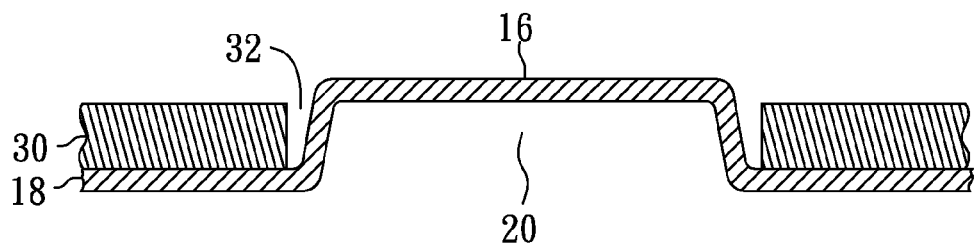
FIGS. 5A-5E are cross-sectional views showing a method of making a supporting board in accordance with an embodiment of the present invention.
Figure 5B:
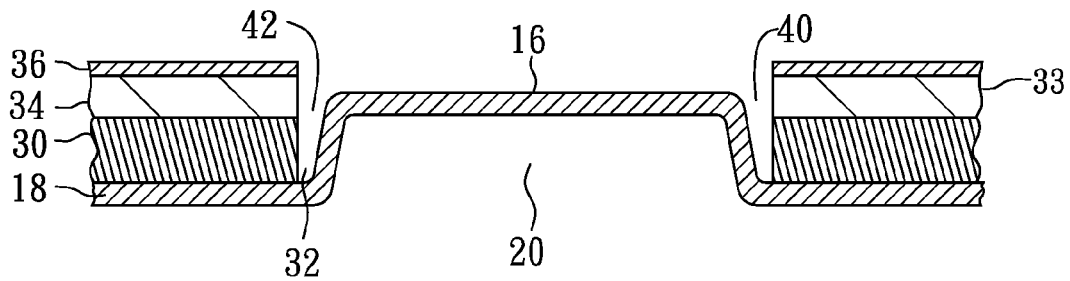
Figure 5C:
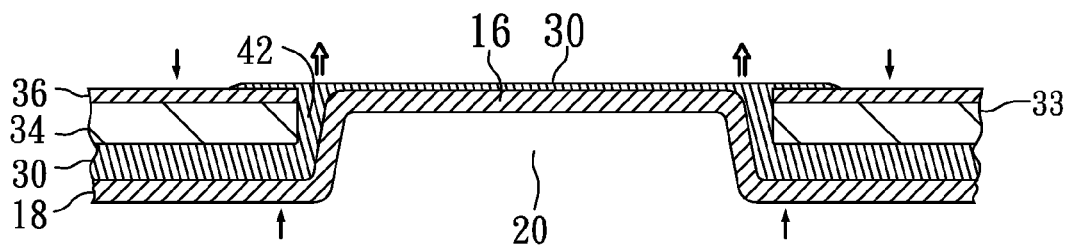
Figure 5D:
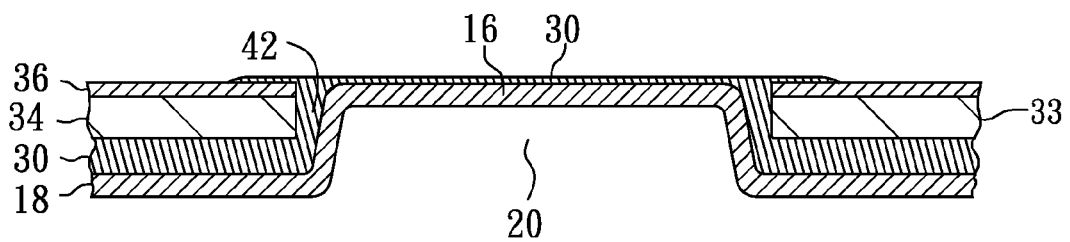
Figure 5E:
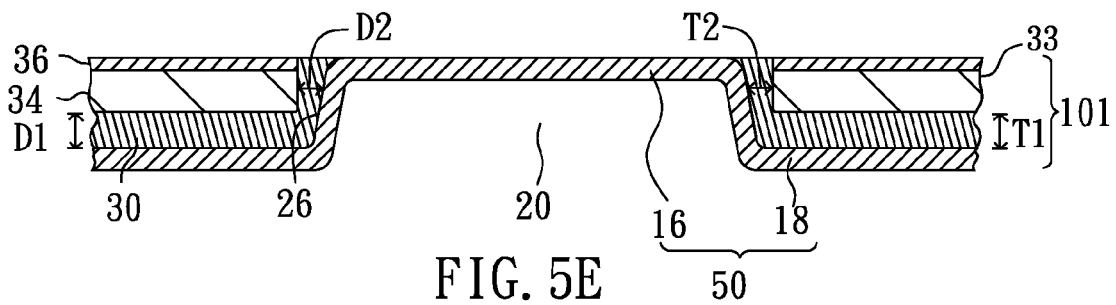

FIGS. 5A-5E are cross-sectional views showing a method of making a supporting board, as shown in FIG. 5E, that includes bump 16, flange 18, adhesive 30 and stiffener 33 in accordance with an embodiment of the present invention.

In FIGS. 5A and 5B the structure is inverted to a cavity-down position so that gravity assists with mounting adhesive 30 and stiffener 33 on flange 18 and in FIGS. 5C-5E the structure remains in the cavity-down position. Thereafter, in FIGS. 6A-6I the structure is inverted again to the cavity-up position as in FIGS. 2A-2D. Thus, cavity 20 faces downward in FIGS. 5A-5E and upward in FIGS. 6A-6I. However, the relative orientation of the structure does not change. Cavity 20 faces in the second vertical direction and is covered by bump 16 in the first vertical direction regardless of whether the structure is inverted, rotated or slanted. Likewise, bump 16 extends beyond stiffener 33 in the second vertical direction and extends from flange 18 in the first vertical direction regardless of whether the structure is inverted, rotated or slanted. Hence, the first and second vertical directions are oriented relative to the structure and remain opposite to one another and orthogonal to the lateral directions.

FIG. 5A is a cross-sectional view of the structure with adhesive 30 mounted on flange 18. Adhesive 30 is mounted by lowering it onto flange 18 as bump 16 is inserted into and through and upwards in opening 32. Adhesive 30 eventually contacts and rests on flange 18. Preferably, bump 16 is inserted into and extends through opening 32 without contacting adhesive 30 and is aligned with and centrally located within opening 32.

FIG. 5B is a cross-sectional view of the structure with stiffener 33 mounted on adhesive 30. Stiffener 33 is mounted by lowering it onto adhesive 30 as bump 16 is inserted into and upwards in aperture 40. Stiffener 33 eventually contacts and rests on adhesive 30.

Bump 16 is inserted into but not through aperture 40 without contacting stiffener 33 and is aligned with and centrally located within aperture 40. As a result, gap 42 is located in aperture 40 between bump 16 and stiffener 33. Gap 42 laterally surrounds bump 16 and is laterally surrounded by stiffener 33. In addition, opening 32 and aperture 40 are precisely aligned with one another and have the same dimension.

At this stage, stiffener 33 is mounted on and contacts and extends above adhesive 30. Bump 16 extends through opening 32 into aperture 40, is 30 microns below the top surface of conductive layer 36 and is exposed through aperture 40 in the upward direction. Adhesive 30 contacts and is sandwiched between flange 18 and substrate 34, contacts substrate 34 but is spaced from conductive layer 36 and remains a non-solidified prepreg with B-stage uncured epoxy, and gap 42 is filled with air.

FIG. 5C is a cross-sectional view of the structure with adhesive 30 in gap 42. Adhesive 30 is flowed into gap 42 by applying heat and pressure. In this illustration, adhesive 30 is forced into gap 42 by applying downward pressure to conductive layer 36 and/or upward pressure to flange 18, thereby moving flange 18 and stiffener 33 towards one another and applying pressure to adhesive 30 while simultaneously applying heat to adhesive 30. Adhesive 30 becomes compliant enough under the heat and pressure to conform to virtually any shape. As a result, adhesive 30 sandwiched between flange 18 and stiffener 33 is compressed, forced out of its original shape and flows into and upward in gap 42. Flange 18 and stiffener 33 continue to move towards one another and adhesive 30 eventually fills gap 42. Moreover, adhesive 30 remains sandwiched between and continues to fill the reduced space between flange 18 and stiffener 33.

For instance, flange 18 and conductive layer 36 can be disposed between top and bottom platens (not shown) of a press. In addition, a top cull plate and top buffer paper (not shown) can be sandwiched between conductive layer 36 and the top platen, and a bottom cull plate and bottom buffer paper (not shown) can be sandwiched between flange 18 and the bottom platen. The stack includes the top platen, top cull plate, top buffer paper, substrate 34 and conductive layer 36, adhesive 30, flange 18, bottom buffer paper, bottom cull plate and bottom platen in descending order. Furthermore, the stack may be positioned on the bottom platen by tooling pins (not shown) that extend upward from the bottom platen through registration holes (not shown) in flange 18.

The platens are heated and move towards one another, thereby applying heat and pressure to adhesive 30. The cull plates disperse the heat from the platens so that it is more uniformly applied to flange 18 and stiffener 33 and thus adhesive 30, and the buffer papers disperse the pressure from the platens so that it is more uniformly applied to flange 18 and stiffener 33 and thus adhesive 30. Initially, stiffener 33 contacts and presses down on adhesive 30. As the platen motion and heat continue, adhesive 30 between flange 18 and stiffener 33 is compressed, melted and flows into and upward in gap 42 and across substrate 34 to conductive layer 36. For instance, the uncured epoxy is melted by the heat and the molten uncured epoxy is squeezed by the pressure into gap 42, however the reinforcement and the filler remain between flange 18 and stiffener 33. Adhesive 30 elevates more rapidly than bump 16 in aperture 40 and fills gap 42. Adhesive 30 also rises slightly above aperture 40 and overflows onto the top surfaces of bump 16 and conductive layer 36 before the platen motion stops. This may occur due to the prepreg being slightly thicker than necessary. As a result, adhesive 30 creates a thin coating on the top surfaces of bump 16 and conductive layer 36. The platen motion is eventually blocked by bump 16 and the platens become stationary but continue to apply heat to adhesive 30.

The upward flow of adhesive 30 in gap 42 is shown by the thick upward arrows, the upward motion of bump 16 and flange 18 relative to stiffener 33 is shown by the thin upward arrows, and the downward motion of stiffener 33 relative to bump 16 and flange 18 is shown by the thin downward arrows.

FIG. 5D is a cross-sectional view of the structure with adhesive 30 solidified.

For instance, the platens continue to clamp bump 16 and flange 18 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 30 as solidified provides a secure robust mechanical bond between bump 16 and stiffener 33 and between flange 18 and stiffener 33. Adhesive 30 can withstand normal operating pressure without distortion or damage and is only temporarily distorted under unusually high pressure. Furthermore, adhesive 30 can absorb thermal expansion mismatch between bump 16 and stiffener 33 and between flange 18 and stiffener 33.

At this stage, bump 16 and conductive layer 36 are essentially coplanar with one another and adhesive 30 and conductive layer 36 extend to a top surface that faces in the upward direction. For instance, adhesive 30 between flange 18 and stiffener 33 has a thickness of 120 microns which is 30 microns less than its initial thickness of 150 microns, bump 16 ascends 30 microns in aperture 40 and stiffener 33 descends 30 microns relative to bump 16. The 300 micron height of bump 16 is essentially the same as the combined height of conductive layer 36 (30 microns), substrate 34 (150 microns) and the underlying adhesive 30 (120 microns). Furthermore, bump 16 continues to be centrally located in opening 32 and aperture 40 and spaced from stiffener 33 and adhesive 30 fills the space between flange 18 and stiffener 33 and fills gap 42. Adhesive 30 extends across stiffener 33 in gap 42. That is, adhesive 30 in gap 42 extends in the upward and downward directions across the thickness of stiffener 33 at the outer sidewall of gap 42. Adhesive 30 also includes a thin top portion above gap 42 that contacts the top surfaces of bump 16 and conductive layer 36 and extends above bump 16 by 10 microns.

FIG. 5E is a cross-sectional view of the structure after upper portions of bump 16, adhesive 30 and conductive layer 36 are removed by grinding. For instance, a rotating diamond sand wheel and distilled water are applied to the top of the structure. Initially, the diamond sand wheel grinds only adhesive 30. As the grinding continues, adhesive 30 becomes thinner as its grinded surface migrates downwardly. Eventually the diamond sand wheel contacts bump 16 and conductive layer 36 (not necessarily at the same time), and as a result, begins to grind bump 16 and conductive layer 36 as well. As the grinding continues, bump 16, adhesive 30 and conductive layer 36 become thinner as their grinded surfaces migrate downwardly. The grinding continues until the desired thickness has been removed. Thereafter, the structure is rinsed in distilled water to remove contaminants.

The grinding removes a 20 micron thick upper portion of adhesive 30, a 10 micron thick upper portion of bump 16 and a 10 micron thick upper portion of conductive layer 36. The decreased thickness does not appreciably affect bump 16 or adhesive 30. However, it substantially reduces the thickness of conductive layer 36 from 30 microns to 20 microns. After the grinding, bump 16, adhesive 30 and conductive layer 36 are coplanar with one another at a smoothed lapped lateral top surface that is above substrate 34 and faces in the upward direction.

At this stage, as shown in FIG. 5E, supporting board 101 includes bump 16, flange 18, adhesive 30 and stiffener 33. Bump 16 is adjacent to flange 18 at bent corner 22, extends from flange 18 in the upward direction and is integral with flange 18. Bump 16 extends into and remains centrally located within opening 32 and aperture 40, and is coplanar at its top with an adjacent portion of adhesive 30. Bump 16 is spaced from stiffener 33 and retains its cut-off pyramidal shape in which its dimension increases as it extends downwardly.

Cavity 20 faces in the downward direction, extends into remains centrally located within bump 16, opening 32 and aperture 40 and is covered by bump 16 in the upward direction. Cavity 20 conforms to the shape of bump 16, extends across most of bump 16 in the vertical and lateral directions and retains its cut-off pyramidal shape in which its dimension decreases as it extends upwardly from its entrance at flange 18.

Flange 18 extends laterally from bump 16, extends below adhesive 30, stiffener 33, opening 32 and aperture 40, contacts adhesive 30 and is spaced from stiffener 33.

Adhesive 30 contacts and is sandwiched between and fills the space between bump 16 and stiffener 33 in gap 42 and contacts stiffener 33 and flange 18 outside gap 42. Adhesive 30 covers and surrounds tapered sidewall 26 of bump 16 in the lateral directions, extends laterally from bump 16 to peripheral edges of the assembly and is solidified. Accordingly, adhesive 30 has first thickness T1 where it is adjacent to flange 18 and second thickness T2 where it is adjacent to bump 16 that is different from first thickness T1. That is, distance D1 in the vertical directions between flange 18 and stiffener 33 is different from distance D2 in the lateral directions between bump 16 and stiffener 33. Furthermore, as adhesive 30 extends away from flange 18 into gap 42 between bump 16 and stiffener 33, adhesive 30 can have an increasing thickness where it is adjacent to bump 16 owing to that bump 16 has an increasing dimension as it extends towards flange 18. Supporting board 101 can accommodate multiple built-in electronic devices (such as interposers and chips) rather than one with a single bump or multiple bumps. Thus, multiple semiconductor devices can be mounted on a single bump or separate semiconductor devices can be mounted on separate bumps.

Supporting board 101 with multiple bumps for multiple semiconductor devices can be accomplished by stamping metal plate 10 to include additional bumps 16, adjusting adhesive 30 to include additional openings 32 and adjusting stiffener 33 to include additional apertures 40.

FIGS. 6A-6L are cross-sectional views showing a method of making an assembly board that includes a supporting board, a built-in electronic device and build-up circuitry in accordance with an embodiment of the present invention.

Figure 6A:
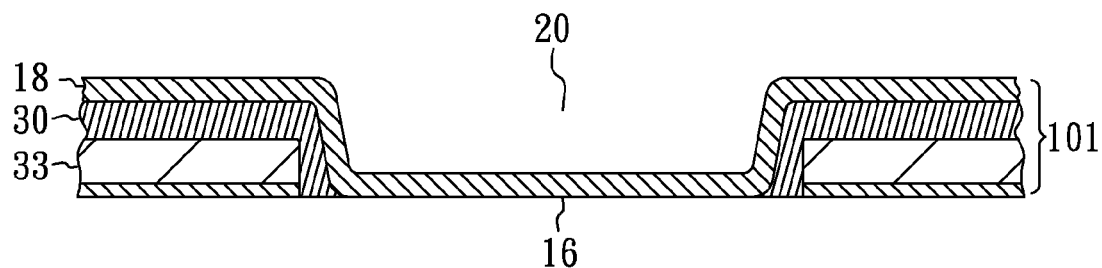
FIGS. 6A-6L are cross-sectional views showing a method of making an assembly board that includes a built-in electronic device, a supporting board and a careless build-up circuitry in accordance with an embodiment of the present invention.
Figure 6B:
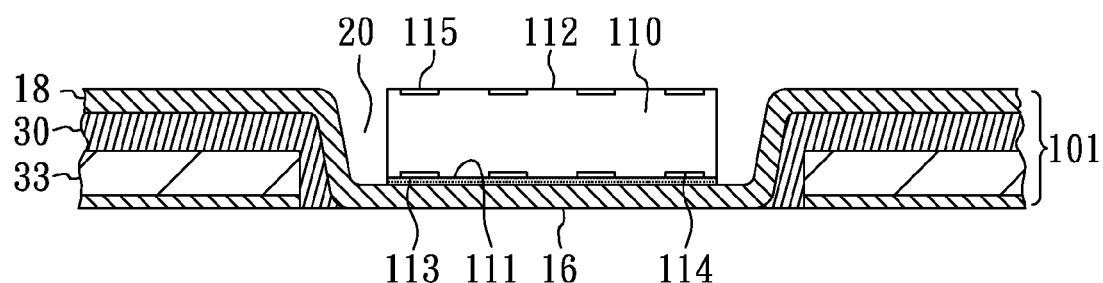
Figure 6C:
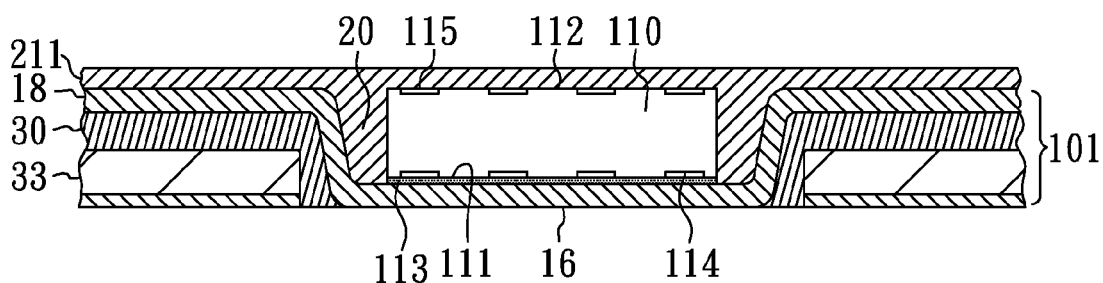
Figure 6D:
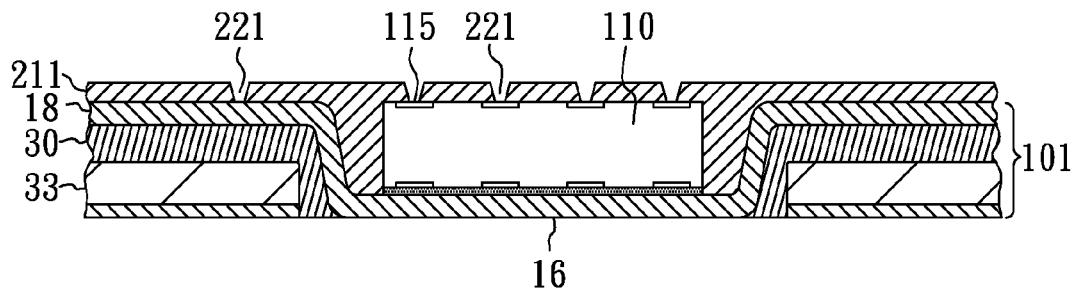
Figure 6E:
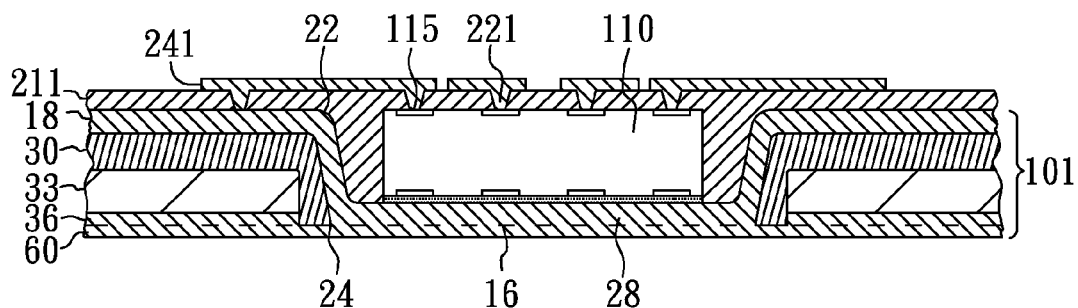
Figure 6F:
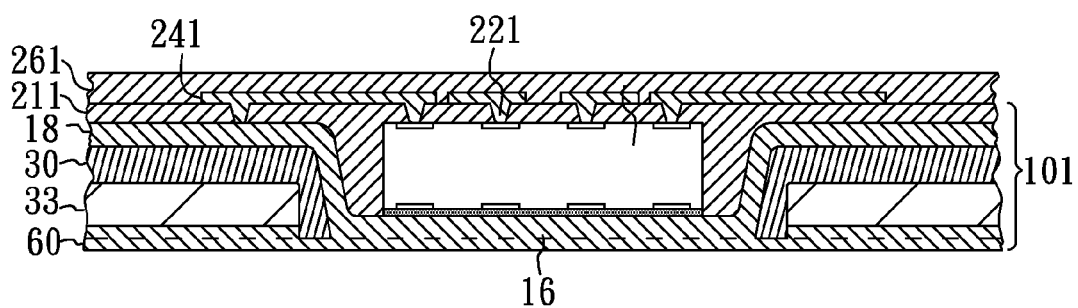
Figure 6G:
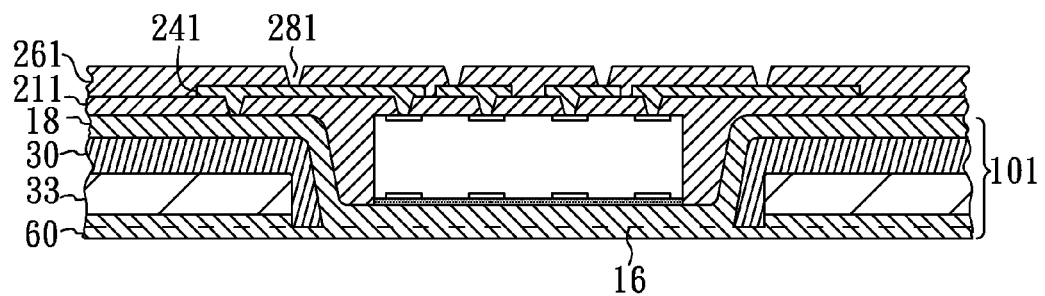
Figure 6H:
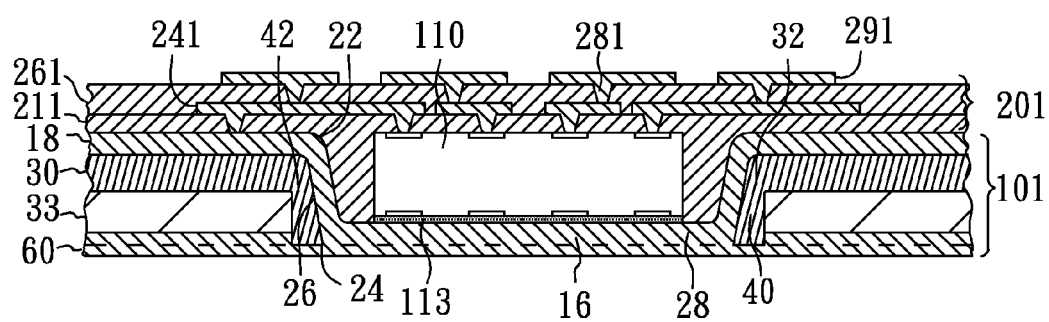
Figure 6I:
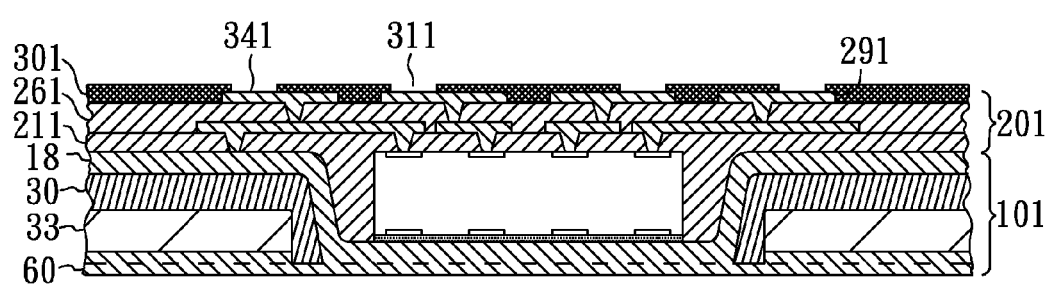
Figure 6J:
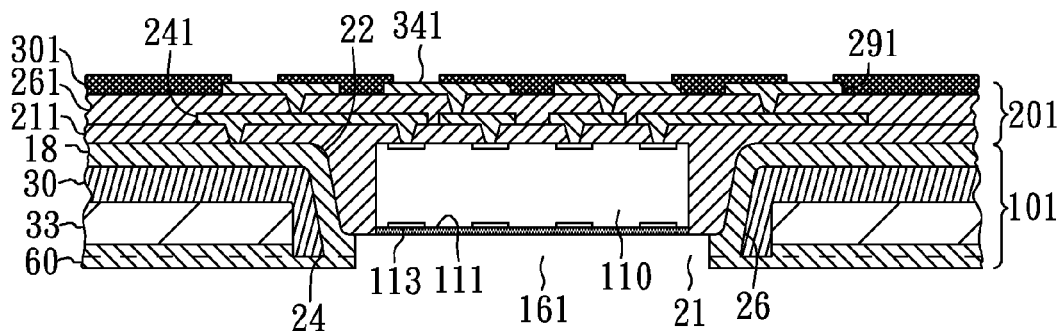
Figure 6K:
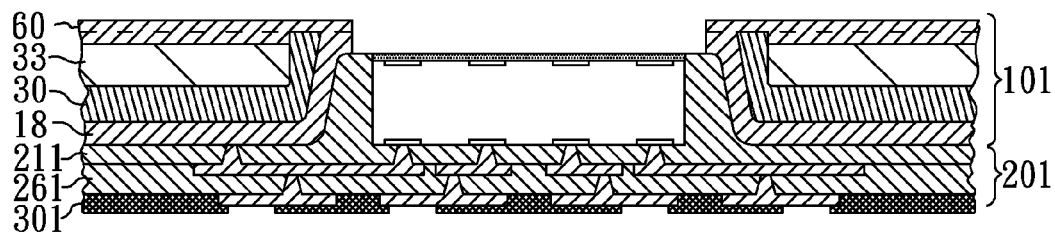
Figure 6L:
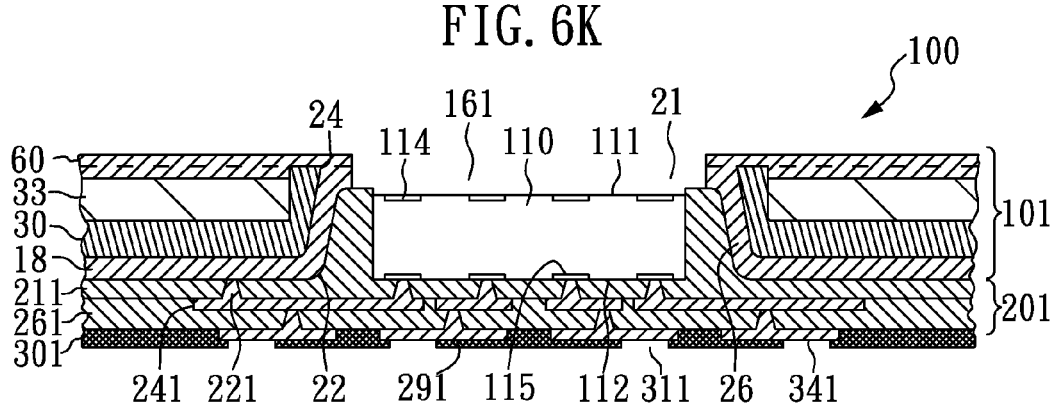

As shown in FIG. 6L, assembly board 100 includes supporting board 101, built-in electronic device 110, build-up circuitry 201 and solder mask material 301. Built-in electronic device 110 includes first surface 111, second surface 112 opposite to first surface 111, first contact pads 114 at first surface 111, second contact pads 115 at second surface 112, and through vias (not shown in the figures) that electrically connect the first contact pads 114 and the second contact pads 115. Built-in electronic device 110 can be a silicon interposer or a ceramic interposer that contains a pattern of traces that fan out from a fine pitch at first contact pads 114 to a coarse pitch at second contact pads 115. Supporting board 101 includes bump 16, flange 18, adhesive 30, stiffener 33, plated layer 60 and via hole 21. Via hole 21 extends through bump 16 and plated layer 60, exposes built-in electronic device 110 from the first vertical direction and is laterally covered by tapered sidewall of bump 16. Build-up circuitry 201 includes first dielectric layer 211, first conductive traces 241, second dielectric layer 261 and second conductive traces 291 which include interconnect pads 341.

FIG. 6A is a cross-sectional view of supporting board 101 after it is inverted from FIG. 5E.

FIG. 6B is a cross-sectional view of supporting board 101 with built-in electronic device 110 mounted on bump 16 by film 113. Built-in electronic device 110, which includes first contact pads 114 on its first surface 111 and second contact pads 115 on its second surface 112, is mounted by lowering it into cavity 20, and eventually rests on bump 16 through film 113. In particular, bump 16 covers built-in electronic device 110 in the downward direction and provides a recessed space for built-in electronic device 110. Film 113 contacts and is sandwiched between bump 16 and built-in electronic device 110.

Film 113 is mounted on first surface 111 of built-in electronic device 110 and then built-in electronic device 110 is placed on bump 16 with built-in electronic device first surface 111 using a pick-up head and an automated pattern recognition system in step-and-repeat fashion. Built-in electronic device 110 has a thickness of 275 microns and film 113 has a thickness of 20 microns. As a result, the combined height of built-in electronic device 110 and the underlying film 113 is 295 microns which is 5 microns less than the depth of cavity 20 (300 microns). Built-in electronic device 110 has a length of 10 mm and width of 8 mm.

Subsequently, build-up circuitry is formed on supporting board 101 and built-in electronic device 110 as described below.

FIG. 6C is a cross-sectional view of the structure with first dielectric layer 211, such as epoxy resin, glass-epoxy, polyimide, and the like, disposed over the built-in electronic device second surface 112, second contact pads 115, bump 16 and flange 18. First dielectric layer 211 extends into and fills the remaining space in cavity 20 and extends beyond built-in electronic device first surface 111 in the downward direction, thereby contacting bump 16, built-in electronic device 110 and film 113 in cavity 20 and is sandwiched between bump 16 and built-in electronic device 110 in cavity 20. First dielectric layer 211 also contacts flange 18 outside cavity 20 and is spaced from adhesive 30. First dielectric layer 211 may be deposited by numerous techniques including lamination, roll coating, spin coating and spray-on deposition. First dielectric layer 211 may be treated by plasma etching or coated with an adhesion promoter (not shown) to promote adhesion before deposition. First dielectric layer 211 has a thickness of 50 microns.

FIG. 6D is a cross-sectional view of the structure showing first via openings 221 formed through first dielectric layer 211 to expose second contact pads 115 and selected portions of flange 18. First via openings 221 are aligned with and expose second contact pads 115 and selected portions of flange 18. First via openings 221 may be formed by numerous techniques including laser drilling, plasma etching and photolithography. Laser drilling can be enhanced by a pulsed laser. Alternatively, a scanning laser beam with a metal mask can be used. First via openings 221 have a diameter of 50 microns.

Referring now to FIG. 6E, first conductive traces 241 are formed on first dielectric layer 211. First conductive traces 241 extend from first dielectric layer 211 in the upward direction, extend laterally on first dielectric layer 211 and extend into first via openings 221 in the downward direction to make electrical contact with second contact pads 115 and flange 18. First conductive trace 241 can be deposited by numerous techniques including electroplating, electroless plating, evaporating, sputtering, and their combinations as a single layer or multiple layers.

For instance, first conductive traces 241 are deposited as a first conductive layer by first dipping the structure in an activator solution to render first dielectric layer 211 catalytic to electroless copper, then a thin copper layer is electrolessly plated to serve as the seeding layer before a second copper layer is electroplated on the seeding layer to a desirable thickness. Alternatively, the seeding layer can be formed by sputtering a thin film such as titanium/copper onto first dielectric layer 211 as well as into first via openings 221 before depositing the electroplated copper layer on the seeding layer. Once the desired thickness is achieved, the first conductive layer (i.e. the combination of the electroplated copper layer and the seeding layer) is patterned to form first conductive traces 241. First conductive traces 241 can be patterned by numerous techniques including wet etching, electro-chemical etching, laser-assist etching, and their combinations.

Also shown in FIG. 6E is plated layer 60 deposited on bump 16, adhesive 30 and conductive layer 36. Plated layer 60 can be deposited by the same activator solution, electroless copper seeding layer and electroplated copper layer as first conductive traces 241. Preferably, plated layer 60 and first conductive traces 241 are the same material deposited simultaneously in the same manner and have the same thickness. Plated layer 60 is an unpatterned copper layer that contacts bump 16, adhesive 30 and conductive layer 36 at the lateral bottom surface and covers them in the downward direction. Bump 16, conductive layer 36 and plated layer 60 are shown as a single layer for convenience of illustration. The boundary (shown in phantom) between bump 16 and plated layer 60 and between conductive layer 36 and plated layer 60 may be difficult or impossible to detect since copper is plated on copper. However, the boundary between adhesive 30 and plated layer 60 is clear.

First conductive traces 241 are shown in cross-section as a continuous circuit traces for convenience of illustration. That is, first conductive traces 241 can provide horizontal signal routing in both the X and Y directions and vertical (top to bottom) routing through first via openings 221 and serve as electrical connections for built-in electronic device 110 and flange 18.

At this stage, as shown in FIG. 6E, supporting board 101 includes bump 16, flange 18, adhesive 30, stiffener 33 and plated layer 60. The build-up circuitry on supporting board 101 and built-in electronic device 110 includes first dielectric layer 211 and first conductive traces 241.

FIG. 6F is a cross-sectional view of the structure showing second dielectric layer 261 disposed on first conductive traces 241 and first dielectric layer 211. Like first dielectric layer 211, second dielectric layer 261 can be epoxy resin, glass-epoxy, polyimide and the like deposited by numerous techniques including film lamination, spin coating, roll coating, and spray-on deposition and has a thickness of 50 microns. Preferably, first dielectric layer 211 and second dielectric layer 261 are the same material with the same thickness formed in the same manner.

FIG. 6G is a cross-sectional view of the structure showing second via openings 281 formed through second dielectric layer 261 to expose selected portions of first conductive traces 241. Like first via openings 221, second via openings 281 can be formed by numerous techniques including laser drilling, plasma etching and photolithography and have a diameter of 50 microns. Preferably, first via openings 221 and second via openings 281 are formed in the same manner and have the same size.

FIG. 6H is a cross-sectional view of the structure showing second conductive traces 291 formed on second dielectric layer 261. Second conductive traces 291 extend from second dielectric layer 261 in the upward direction, extend laterally on second dielectric layer 261 and extend into second via openings 281 in the downward direction to make electrical contact with first conductive traces 241, and therefore electrical connection with built-in electronic device 110 and flange 18.

Second conductive traces 291 can be deposited as a second conductive layer by numerous techniques including electrolytic plating, electroless plating, sputtering, and their combinations and then patterned by numerous techniques including wet etching, electro-chemical etching, laser-assist etching, and their combinations. Preferably, first conductive traces 241 and second conductive traces 291 are the same material with the same thickness formed in the same manner.

At this stage, as shown in FIG. 6H, build-up circuitry 201 includes first dielectric layer 211, first conductive traces 241, second dielectric layer 261 and second conductive traces 291.

Bump 16 is adjacent to flange 18 at bent corner 22, is adjacent to plated layer 60 at bent corner 24 and at floor 28, extends from plated layer 60 in the upward direction, extends from flange 18 in the downward direction and is integral with flange 18. Bump 16 extends into and remains centrally located within opening 32 and aperture 40, and is coplanar at its bottom with an adjacent portion of adhesive 30 that contacts plated layer 60. Bump 16 also contacts adhesive 30, is spaced from stiffener 33 and retains its cut-off pyramidal shape in which its dimension increases as it extends upwardly from plated layer 60 to flange 18.

Adhesive 30 contacts and is sandwiched between and fills the space between bump 16 and stiffener 33 in gap 42, contacts stiffener 33 and flange 18 outside gap 42, contacts plated layer 60, and extends laterally from bump 16 to peripheral edges of supporting board 101 and is solidified. Adhesive 30 covers and surrounds bent corners 22, 24 and tapered sidewall 26 of bump 16 in the lateral directions, covers plated layer 60 outside the periphery of bump 16 in the upward direction, covers stiffener 33 in the upward direction and covers flange 18 in the downward direction. Adhesive 30 has a first thickness where it is adjacent to the flange 18 and a second thickness where it is adjacent to the bump 16 that is different from the first thickness.

FIG. 6I is a cross-sectional view of the structure showing solder mask material 301 disposed over second dielectric layer 261 and second conductive traces 291. Solder mask material 301 includes solder mask openings 311 that expose selected portions of second conductive traces 291 to define interconnect pads 341. Interconnect pads 341 can accommodate a conductive joint, such as solder bump, solder ball, pin, and the like, for electrical communication and mechanical attachment with external components or a PCB. Solder mask openings 311 may be formed by numerous techniques including photolithography, laser drilling and plasma etching.

FIG. 6J is a cross-sectional view of the structure showing window 161 formed at a surface of supporting board 101. Window 161 is aligned with first surface 111 of built-in electronic device 110 and formed by removing a selected portion of floor 28 of bump 16 and a selected portion of plated layer 60 adjacent to floor 28, thereby forming via hole 21 that extends through bump 16 and plated layer 60 in vertical directions, extends across most of bump 16 in lateral directions and is laterally covered by tapered sidewall 26 of bump 16. Window 161 exposes film 113 and first dielectric layer 211 adjacent to floor 28 in the downward direction. Window 161 can be formed by numerous techniques including wet etching, electro-chemical etching, laser-assist etching, and their combinations. Window 161 has a dimension of 10.25 microns by 8.25 microns.

FIG. 6K is a cross-sectional view of the structure after it is inverted from FIG. 6J.

FIG. 6L is a cross-sectional view of the structure showing removal of film 113 from first surface 111 of built-in electronic device 110. Film 113 can be decomposed by UV light so that film 113 can be peeled off first surface 111 of built-in electronic device 110, thereby exposing first surface 111 of built-in electronic device 110 through window 161 in the upward direction.

At this stage, as shown in FIG. 6L, assembly board 100 includes build-up circuitry 201, built-in electronic device 110 and supporting board 101 wherein via hole 21 is formed in supporting board 101 and exposes built-in electronic device 110. Supporting board 101 includes bump 16, flange 18, adhesive 30, stiffener 33 and plated layer 60. Bump 16 includes bent corners 22 and 24, tapered sidewall 26 and a selected portion of floor 28.

Figure 7:
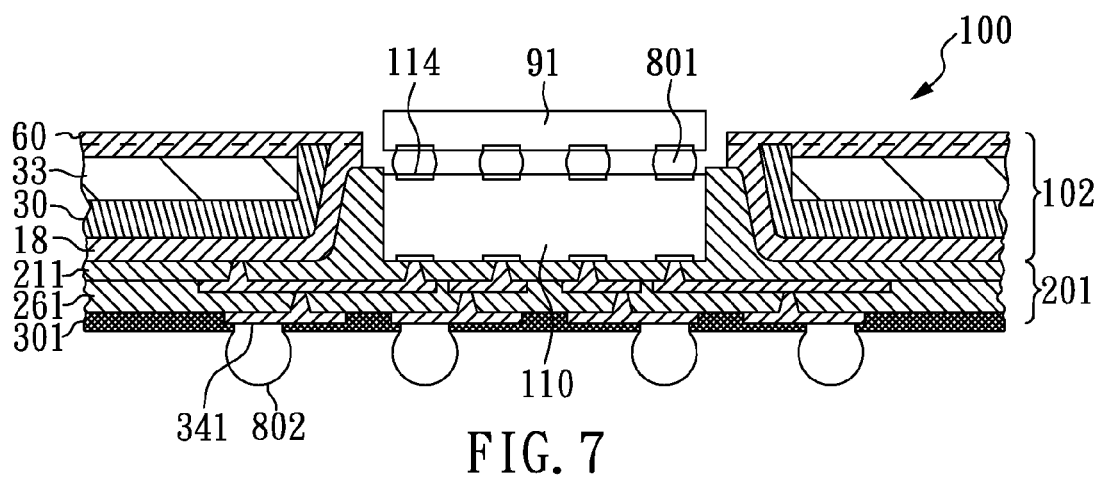
FIG. 7 is a cross-sectional view showing a three-dimensional assembly that includes a semiconductor device attached to a built-in electronic device of an assembly board in accordance with an embodiment of the present invention.

FIG. 7 is a cross-sectional view showing a three-dimensional stacking structure in which semiconductor device 91 is mounted on built-in electronic device 110 at window 161 via bumps 801. Bumps 801 can include various materials including tin, gold or their alloys. Solder balls 802 at the surface of build-up circuitry 201 can be provided by numerous techniques including screen printing solder paste followed by a reflow process or by electroplating.

Embodiment 2

Figure 8:
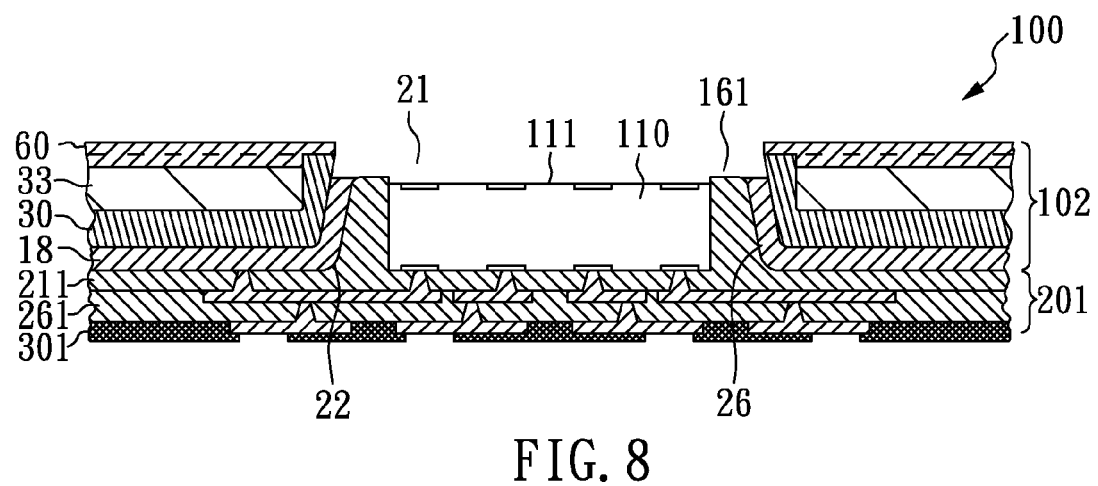
FIG. 8 is a cross-sectional view showing an assembly board that includes a careless build-up circuitry, a built-in electronic device, a supporting board and an enlarged window in accordance with another embodiment of the present invention.

FIG. 8 is a cross-sectional view showing assembly board 100 with extended window 161 in accordance with another embodiment of the present invention.

In this embodiment, the assembly board is manufactured in a manner similar to that illustrated in Embodiment 1, except that window 161 is formed by removing bent corner 24, entire floor 28 of bump 16 and selected portions of plated layer 60 adjacent to bent corner 24 and floor 28. Window 161 has a dimension of 11 microns by 9 microns.

Embodiments 3-4

Figure 9:
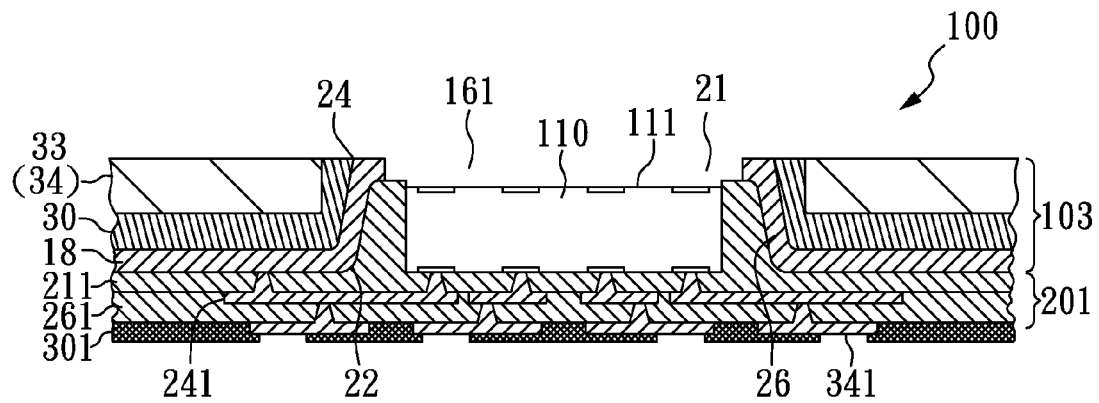
FIGS. 9 and 10 are cross-sectional views showing an assembly board that includes a careless build-up circuitry, a built-in electronic device and a supporting board using a substrate as a stiffener in accordance with other embodiments of the present invention.
Figure 10:
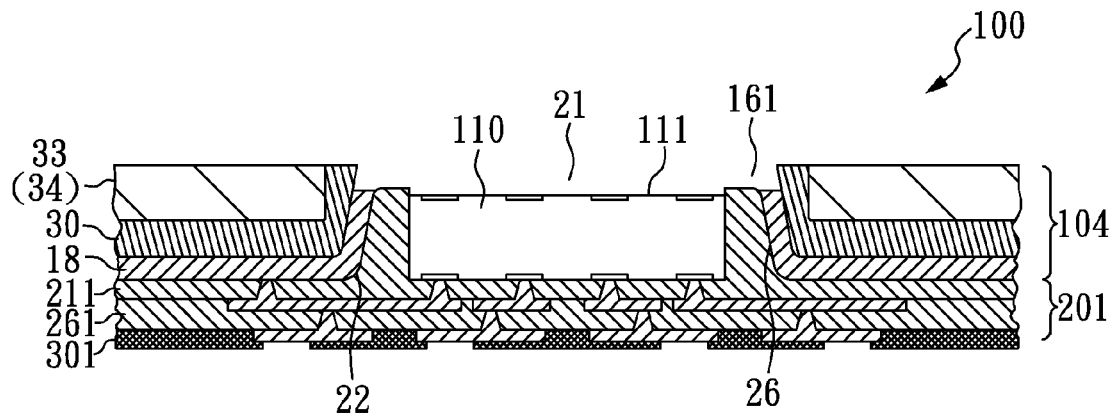

FIGS. 9-10 are cross-sectional views showing assembly boards using substrate 34 with no conductive layer laminated thereon as stiffener 33.

In these embodiments, substrate 34 alone is applied as stiffener 33 with no conductive layer laminated thereon. Supporting boards 103 and 104 can be manufactured in a manner similar to supporting boards 101 and 102, respectively. For instance, adhesive 30 is mounted on flange 18, substrate 34 alone as stiffener 33 is mounted on adhesive 30, heat and pressure are applied to flow and solidify adhesive 30 and then grinding is applied to planarize bump 16, adhesive 30 and substrate 34 at a lateral surface. As a result, as shown in FIG. 9, adhesive 30 contacts and is sandwiched between substrate 34 and flange 18, covers and surrounds bent corners 22, 24 and tapered sidewall 26 in the lateral directions, extends beyond tapered sidewall 26, first surface 111 of built-in electronic device 110 and first dielectric layer 211 in the upward direction and is coplanar with substrate 34 and bump 16 at bent corner 24. Alternatively, as shown in FIG. 10, adhesive 30 contacts and is sandwiched between substrate 34 and flange 18, covers and surrounds bent corner 22 and tapered sidewall 26 in the lateral directions, extends beyond bump 16, first surface 111 of built-in electronic device 110 and first dielectric layer 211 in the upward direction and surrounds peripheral edges of window 161.

Embodiments 5-6

Figure 11:
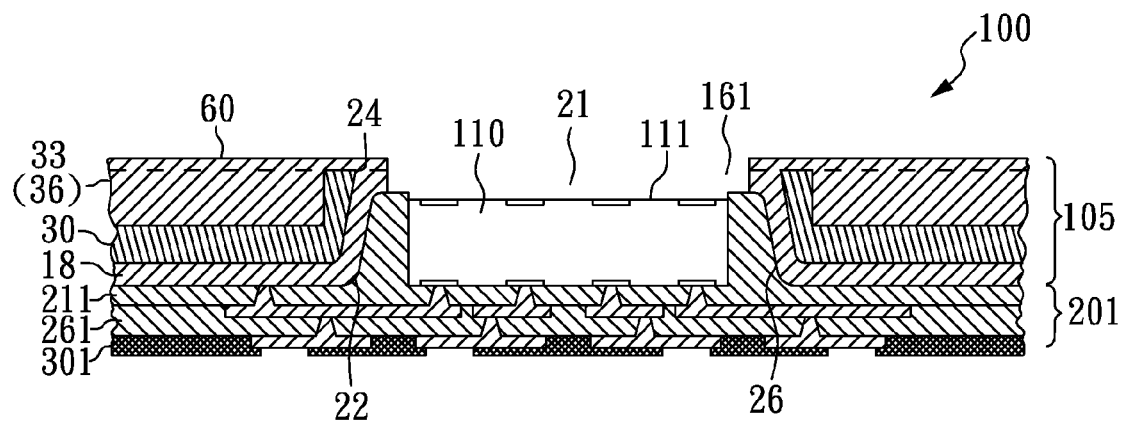
FIGS. 11 and 12 are cross-sectional views showing an assembly board that includes a coreless build-up circuitry, a built-in electronic device and a supporting board using a conductive layer as a stiffener in accordance with other embodiments of the present invention
Figure 12:
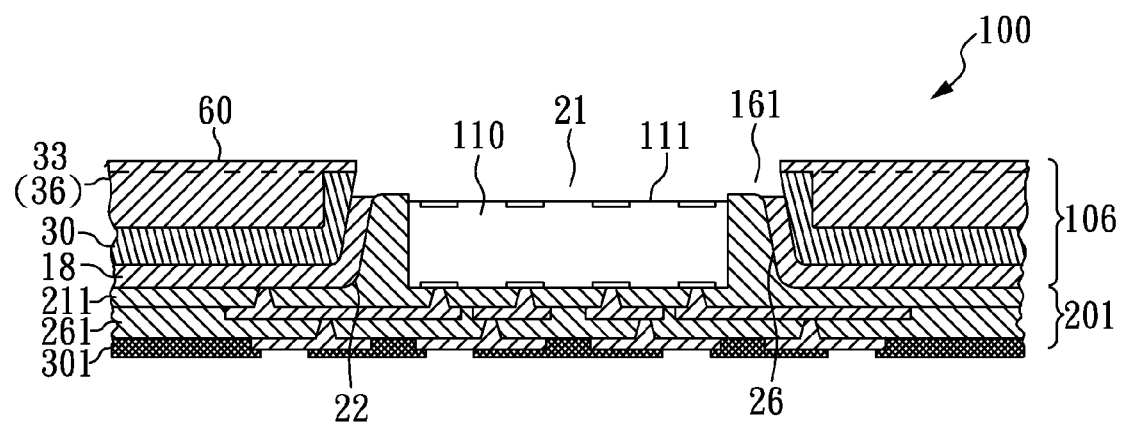

FIGS. 11-12 are cross-sectional views showing assembly boards using conductive layer 36 as stiffener 33.

In these embodiments, thick conductive layer 36 is applied as stiffener 33 and the substrate is omitted. For instance, conductive layer 36 has a thickness of 130 microns rather than 30 microns) so that it can be handled without warping or wobbling. Supporting boards 105 and 106 can be manufactured in a manner similar to supporting boards 101 and 102, respectively, with suitable adjustments for conductive layer 36. For instance, adhesive 30 is mounted on flange 18, conductive layer 36 alone is mounted on adhesive 30, heat and pressure are applied to flow and solidify adhesive 30 and then grinding is applied to planarize bump 16, adhesive 30 and conductive layer 36 at a lateral surface. As a result, as shown in FIG. 11, adhesive 30 contacts and is sandwiched between conductive layer 36 and flange 18, covers and surrounds bent corners 22, 24 and tapered sidewall 26 in the lateral directions, extends beyond tapered sidewall 26, first surface 111 of built-in electronic device 110 and first dielectric layer 211 in the upward direction and is coplanar with conductive layer 36 and bump 16 at bent corner 24. Alternatively, as shown in FIG. 12, adhesive 30 contacts and is sandwiched between conductive layer 36 and flange 18, covers and surrounds bent corner 22 and tapered sidewall 26 in the lateral directions, extends beyond bump 16, first surface 111 of built-in electronic device 110 and first dielectric layer 211 in the upward direction and surrounds peripheral edges of window 161.

The three dimensional semiconductor assemblies and assembly boards described above are merely exemplary. Numerous other embodiments are contemplated. In addition, the embodiments described above can be mixed-and-matched with one another and with other embodiments depending on design and reliability considerations. For instance, the stiffener can include ceramic material or epoxy-based laminate, and can have embedded single-level conductive traces or multi-level conductive traces. The supporting board can accommodate multiple built-in electronic devices and the build-up circuitry can include additional conductive traces to accommodate additional built-in electronic devices. For instance, the supporting board can include a bump with via hole for placing a built-in electronic device therein and multiple bumps each with a cavity for placing passive components therein.

As shown in the above embodiments, a semiconductor device can share or not share the built-in electronic device with other semiconductor devices. For instance, a single semiconductor device can be mounted on the built-in electronic device. Alternatively, numerous semiconductor devices can be mounted on the built-in electronic device. For instance, four small chips in a 2×2 array can be attached to the built-in electronic device and the built-in electronic device can include additional contact pads to receive and route additional chip pads. This may be more cost effective than providing a built-in electronic device for each chip. The semiconductor device can be a packaged or unpackaged chip. Furthermore, the semiconductor device can be a bare chip, LGA, or QFN, etc. A semiconductor device can be mechanically and electrically connected to the built-in electronic device using a wide variety of connection media including gold or solder bumps. The bump can be customized for the built-in electronic device. For instance, the bump can have a square or rectangular shape at its floor with the same or similar topography as the built-in electronic device.

The supporting board can provide a robust mechanical support for the built-in electronic device and the build-up circuitry and the stiffener can provide critical mechanical support for the supporting board. The adhesive in the supporting board can provide consistent bond lines between the bump/flange and the stiffener.

The bump/flange can prevent the supporting board from warping during metal grinding, built-in electronic device mounting and build-up circuitry formation.

The term "adjacent" refers to elements that are integral (single-piece) or in contact (not spaced or separated from) with one another. For instance, the bump is adjacent to the flange but not the stiffener.

The term "overlap" refers to above and extending within a periphery of an underlying element. Overlap includes extending inside and outside the periphery or residing within the periphery. For instance, in the cavity-up position, the flange overlaps the stiffener since an imaginary vertical line intersects the flange and the stiffener, regardless of whether another element such as the adhesive is between the flange and the stiffener and is intersected by the line, and regardless of whether another imaginary vertical line intersects the flange but not the stiffener (within the aperture of the stiffener). Likewise, the adhesive overlaps the stiffener, the flange overlaps the adhesive and the adhesive is overlapped by the stiffener. Moreover, overlap is synonymous with over and overlapped by is synonymous with under or beneath.

The term "contact" refers to direct contact. For instance, the stiffener contacts the adhesive but does not contact the bump.

The term "cover" refers to complete coverage in a vertical and/or lateral direction. For instance, in the cavity-up position, the bump covers the built-in electronic device in the downward direction but the built-in electronic device does not cover the bump in the upward direction when the floor of the bump is not removed.

The term "layer" refers to patterned and un-patterned layers. For instance, the conductive layer can be an un-patterned blanket sheet on the substrate when the stiffener including the conductive layer and the substrate is mounted on the adhesive. Furthermore, a layer can include stacked layers.

The terms "opening" and "aperture" and "via hole" refer to a through hole and are synonymous. For instance, in the cavity-down position, the bump is exposed by the adhesive in the upward direction when it is inserted into the opening in the adhesive. Likewise, the bump is exposed by the stiffener in the upward direction when it is inserted into the aperture in the stiffener.

The term "inserted" refers to relative motion between elements. For instance, the bump is inserted into the aperture regardless of whether the flange is stationary and the stiffener moves towards the flange, the stiffener is stationary and the flange moves towards the stiffener or the flange and the stiffener both approach the other. Furthermore, the bump is inserted (or extends) into the aperture regardless of whether it goes through (enters and exits) or does not go through (enters without exiting) the aperture.

The phrase "move towards one another" also refers to relative motion between elements. For instance, the flange and the stiffener move towards one another regardless of whether the flange is stationary and the stiffener moves towards the flange, the stiffener is stationary and the flange moves towards the stiffener or the flange and the stiffener both approach the other.

The phrase "aligned with" refers to relative position between elements. For instance, the bump is aligned with the aperture when the adhesive is mounted on the flange, the stiffener is mounted on the adhesive, the bump is inserted into and aligned with the opening and the aperture is aligned with the opening regardless of whether the bump is inserted into the aperture or is below and spaced from the aperture.

The phrase "mounted on" includes contact and non-contact with a single or multiple support element(s). For instance, the built-in electronic device is mounted on the bump regardless of whether it contacts the bump or is separated from the bump by a film.

The phrase "adhesive . . . in the gap" refers to the adhesive in the gap. For instance, adhesive that extends across the stiffener in the gap refers to the adhesive in the gap that extends across the stiffener. Likewise, adhesive that contacts and is sandwiched between the bump and the stiffener in the gap refers to the adhesive in the gap that contacts and is sandwiched between the bump at the inner sidewall of the gap and the stiffener at the outer sidewall of the gap.

The phrase "electrical connection" or "electrically connects" or "electrically connected" refers to direct and indirect electrical connection. For instance, the first conductive trace provides an electrical connection between the interconnect pad and the second contact pad regardless of whether the first conductive trace is adjacent to the interconnect pad or electrically connected to the interconnect pad by the second conductive trace.

The term "above" refers to upward extension and includes adjacent and non-adjacent elements as well as overlapping and non-overlapping elements. For instance, in the cavity-down position, the bump extends above, is adjacent to and protrudes from the flange.

The term "below" refers to downward extension and includes adjacent and non-adjacent elements as well as overlapping and non-overlapping elements. For instance, in the cavity-up position, the bump extends below, is adjacent to and protrudes from flange in the downward direction. Likewise, the bump extends below the stiffener even though it is not adjacent to or overlapped by the stiffener.

The "first vertical direction" and "second vertical direction" do not depend on the orientation of the electronic assembly (or the assembly board), as will be readily apparent to those skilled in the art. For instance, the bump extends vertically beyond the stiffener in the second vertical direction and vertically beyond the flange in the first vertical direction regardless of whether the assembly board is inverted. Likewise, the flange extends "laterally" from the bump in a lateral plane regardless of whether the assembly board is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the downward direction and the second vertical direction is the upward direction in the cavity-up position, and the first vertical direction is the upward direction and the second vertical direction is the downward direction in the cavity-down position.

The assembly board and the semiconductor assembly using the same according to the present invention have numerous advantages. The assembly board and the semiconductor assembly are reliable, inexpensive and well-suited for high volume manufacture. Compared to conventional art that provides an interposer between a high I/O device and a high density interconnect board with a core layer, the present invention can greatly improve the electrical performance as well as reduce the height of products by using coreless build-up circuitry.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional packaging techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A three-dimensional semiconductor assembly board, comprising:
   a supporting board that includes a bump, a flange, a stiffener, an adhesive and a via hole, wherein (i) the bump is adjacent to and integral with the flange and extends from the flange in a first vertical direction, (ii) the flange extends laterally from the bump in lateral directions orthogonal to the first vertical direction, (iii) the via hole extends into the bump, and is laterally covered by a sidewall of the bump, (iv) the stiffener includes an aperture with the bump extending thereinto, and (v) the adhesive includes an opening with the bump extending thereinto, contacts the bump, the flange and the stiffener, is sandwiched between the bump and the stiffener and between the flange and the stiffener and extends laterally from the bump to peripheral edges of the assembly board;
   a built-in electronic device that includes a first contact pad and a second contact pad and extends into the via hole, wherein the first contact pad faces the first vertical direction and the second contact pad faces the second vertical direction; and
   a coreless build-up circuitry that extends from the built-in electronic device and the flange in the second vertical direction and includes a first dielectric layer, a first via opening and a first conductive trace, wherein the first via opening in the first dielectric layer is aligned with the second contact pad of the built-in electronic device, and the first conductive trace extends from the first dielectric layer in the second vertical direction and extends through the first via opening in the first vertical direction and directly contacts the second contact pad.

2. The assembly board of claim 1, wherein the electrical connection between the built-in electronic device and the coreless build-up circuitry is devoid of solder.

3. The assembly board of claim 1, wherein the first dielectric layer of the coreless build-up circuitry further extends into the via hole and is sandwiched between the peripheral edges of the built-in electronic device and the bump.

4. The assembly board of claim 1, wherein the coreless build-up circuitry thermally contacts and electrically connects with the supporting board at flange through an additional first via opening aligned with the flange and the first conductive trace extends through the additional first via opening in the first vertical direction.

5. The assembly board of claim 1, wherein the coreless build-up circuitry further includes:
   a second dielectric layer that extends from the first dielectric layer and the first conductive trace in the second vertical direction and includes a second via opening aligned with the first conductive trace; and
   a second conductive trace that extends from the second dielectric layer in the second vertical direction and extends laterally on the second dielectric layer and extends through the second via opening in the first vertical direction to the first conductive trace to provide an electrical connection for the first conductive trace.

6. The assembly board of claim 1, wherein the built-in electronic device is an interposer with a through via that electrically connects the first contact pad and the second contact pad.

7. A three-dimensional semiconductor assembly board, comprising:
   a supporting board that includes a bump, a flange, an adhesive and a via hole, wherein (i) the bump is adjacent to and integral with the flange and extends from the flange in a first vertical direction, (ii) the flange extends laterally from the bump in lateral directions orthogonal to the first vertical direction, (iii) the via hole extends into the bump, and is laterally covered by a sidewall of the bump, and (iv) the adhesive includes an opening with the bump extending thereinto, contacts the bump and the flange, laterally covers and surrounds and conformally coats the sidewall of the bump and extends laterally from the bump to peripheral edges of the assembly board;

a built-in electronic device that includes a first contact pad and a second contact pad and extends into the via hole, wherein the first contact pad faces the first vertical direction and the second contact pad faces the second vertical direction;

a coreless build-up circuitry that extends from the built-in electronic device and the flange in the second vertical direction and includes a first dielectric layer, a first via opening and a first conductive trace, wherein the first via opening in the first dielectric layer is aligned with the second contact pad of the built-in electronic device and the first conductive trace extends from the first dielectric layer in the second vertical direction and extends through the first via opening in the second vertical direction and directly contacts the second contact.

8. The assembly board of claim 7, wherein the electrical connection between the built-in electronic device and the coreless build-up circuitry is devoid of solder.

9. The assembly board of claim 7, wherein the first dielectric layer of the coreless build-up circuitry further extends into the via hole and is sandwiched between the peripheral edges of the built-in electronic device and the bump.

10. The assembly board of claim 7, wherein the coreless build-up circuitry thermally contacts and electrically connects with the supporting board at flange through an additional first via opening aligned with the flange and the first conductive trace extends through the additional first via opening in the first vertical direction.

11. The assembly board of claim 7, wherein the coreless build-up circuitry further includes:

a second dielectric layer that extends from the first dielectric layer and the first conductive trace in the second vertical direction and includes a second via opening aligned with the first conductive trace; and a second conductive trace that extends from the second dielectric layer in the second vertical direction and extends laterally on the second dielectric layer and extends through the second via opening in the first vertical direction to the first conductive trace to provide an electrical connection for the first conductive trace.

12. The assembly board of claim 7, wherein the electronic device is an interposer with a through via that electrically connects the first contact pad and the second contact pad.

* * * * *